(12) United States Patent
Fukuzumi et al.

(10) Patent No.: US 8,497,709 B2
(45) Date of Patent: Jul. 30, 2013

(54) INPUT/OUTPUT CIRCUIT AND SYSTEM

(75) Inventors: Norihiko Fukuzumi, Kawasaki (JP);
Toshie Kato, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 109 days.

(21) Appl. No.: 13/016,452

(22) Filed: Jan. 28, 2011

(65) Prior Publication Data

US 2011/0279167 A1 Nov. 17, 2011

(30) Foreign Application Priority Data

May 11, 2010 (JP) ................................. 2010-109462

(51) Int. Cl.
*G01R 19/00* (2006.01)
(52) U.S. Cl.
USPC ................................. 327/52; 327/63; 330/252
(58) Field of Classification Search
USPC ................................. 327/52, 63, 108; 330/252
See application file for complete search history.

(56) References Cited

U.S. PATENT DOCUMENTS

| 6,084,424 A * | 7/2000 | Gasparik | 326/30 |
|---|---|---|---|
| 6,388,519 B1 | 5/2002 | Tachimori | |
| 6,466,090 B1 * | 10/2002 | Giuroiu | 330/86 |
| 6,735,110 B1 * | 5/2004 | Lesea | 365/154 |
| 7,411,421 B1 * | 8/2008 | Steinke et al. | 326/83 |
| 7,512,183 B2 * | 3/2009 | Haridass et al. | 375/257 |
| 2009/0140778 A1 * | 6/2009 | Kikuchi et al. | 327/108 |
| 2010/0013686 A1 * | 1/2010 | Tsuchi | 341/122 |
| 2010/0039141 A1 * | 2/2010 | Ou | 327/62 |
| 2011/0084762 A1 * | 4/2011 | Ou | 330/254 |
| 2012/0155559 A1 * | 6/2012 | Yamasaki | 375/257 |

FOREIGN PATENT DOCUMENTS

| JP | 2000-156616 A | 6/2000 |
|---|---|---|
| JP | 2005-018312 A | 1/2005 |

* cited by examiner

*Primary Examiner* — Ryan Jager
(74) *Attorney, Agent, or Firm* — Arent Fox LLP

(57) ABSTRACT

An input/output circuit has a first load having one end coupled to a first standard voltage line, a first MOS transistor having a drain electrode coupled to another end of the first load, a second load having one end coupled to the first standard voltage line, a second MOS transistor having a drain electrode coupled to another end of the second load, a third MOS transistor having a source electrode each of which is coupled to source electrodes of the first and second MOS transistors, a first constant-current source coupled between the source electrode of the first MOS transistor and a second standard voltage line, and a second constant-current source coupled between the source electrode of the second MOS transistor and the second standard voltage line. The circuit size is reduced by transmitting a differential signal or a single-ended signal using a single input/output circuit.

10 Claims, 14 Drawing Sheets

INPUT/OUTPUT CIRCUIT AND SYSTEM

CROSS-REFERENCE TO RELATED APPLICATION

This application is based upon and claims the benefit of priority of the prior Japanese Patent Application No. 2010-109462, filed on May 11, 2010, the entire contents of which are incorporated herein by reference.

FIELD

The present embodiments relate to an input/output circuit which inputs or outputs a signal, and a system having an input/output circuit.

BACKGROUND

When processing a signal having a high transmission speed, a differential signal is input or output using a differential amplifier circuit. Although transmission using a differential signal may increase the transmission speed, it requires two signal lines. On the contrary, although transmission using a so-called single-ended signal has a low signal transmission speed, the number of signal lines may be reduced in comparison with differential transmission. In order to reduce the number of signal lines, for example, two single-ended signals are transmitted using two signal lines for differential signals. Related arts are discussed in Japanese Laid-open Patent Publication Nos. 2000-156616 and 2005-018312.

When sharing a signal line between a differential signal and a single-ended signal, the differential signal is transmitted from a dedicated transmitter circuit and received by a dedicated receiver circuit. The single-ended signal is transmitted from a dedicated transmitter circuit and received by a dedicated receiver circuit. Therefore, although a signal line may be shared, the size of the receiver circuit and the transmitter circuit may not be reduced.

SUMMARY

According to an aspect of the embodiments, an input/output circuit has a first load having one end coupled to a first standard voltage line, a first MOS transistor having a drain electrode coupled to another end of the first load, a second load having one end coupled to the first standard voltage line, a second MOS transistor having a drain electrode coupled to another end of the second load, a third MOS transistor having a source electrode coupled to one of a source electrode of the first MOS transistor and a source electrode of the second MOS transistor and having a drain electrode coupled to another of the source electrode of the first MOS transistor and the source electrode of the second MOS transistor, a first constant-current source coupled between the source electrode of the first MOS transistor and a second standard voltage line, and a second constant-current source coupled between the source electrode of the second MOS transistor and the second standard voltage line.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

Figure 1:
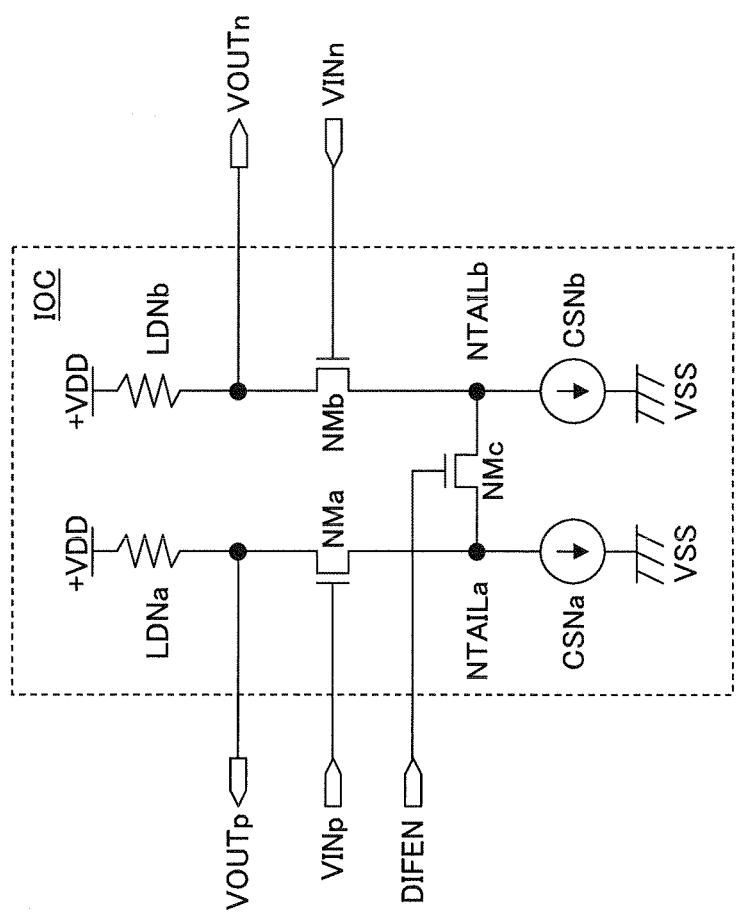
FIG. 1 illustrates an example of an input/output circuit in an embodiment.

An embodiment will be described below, referring to the drawings. The double square marks in the drawings indicate external terminals. An external terminal is, for example, a pad on a semiconductor chip, or a lead of a package in which the semiconductor chip is accommodated. A symbol identical to the terminal name is used for a signal supplied via an external terminal.

FIG. 1 illustrates an example of an input/output circuit IOC in an embodiment. The input-output circuit IOC has loads LDNa and LDNb, MOS transistors NMa, NMb and NMc, and constant-current sources CSNa and CSNb. The loads LDNa and LDNb are resistor elements, for example. The symbol "NM" of the MOS transistor indicates an n-channel transistor. The load LDNa has its one end coupled to a power supply Line+VDD, which is one of the standard voltage lines that supply a standard voltage, and the other end coupled to an output line VOUTp. The load LDNb has its one end coupled to the power supply Line+VDD and the other end coupled to an output line VOUTn.

The MOS transistor NMa has its drain electrode coupled to the other end of the load LDNa, its gate electrode coupled to an input line VINp, and its source electrode coupled to the constant-current source CSNa via a node NTAILa. The MOS transistor NMb has its drain electrode coupled to the other end of the load LDNb, its gate electrode coupled to an input line VINn, and its source electrode coupled to the constant-current source CSNb via a node NTAILb. The transistor NMc has one of its source electrode and drain electrode coupled to the source electrode of the MOS transistor NMa, and the other of its source electrode and drain electrode coupled to the source electrode of the MOS transistor NMb. In addition, the transistor NMc has its gate electrode coupled to a differential enable signal line DIFEN. The differential enable signal line DIFEN is set to a high level when the input/output circuit IOC operates in a differential mode and set to a low level when the input/output circuit IOC operates in a single mode. The differential and single modes will be described below.

The constant-current source CSNa is coupled between the source electrode of the MOS transistor NMa and a ground line VSS, which is a standard voltage line that supplies another standard voltage. The constant-current CSNb is coupled between the source electrode of the MOS transistor NMb and the ground line VSS.

In this embodiment, the input/output circuit IOC couples the constant-current sources CSNa and CSNb together during the differential mode that receives the high level differential enable signal DIFEN, and causes them to commonly operate as a single constant-current source. Accordingly, the input/output circuit IOC operates as a differential amplifier circuit which receives a differential signal in a pair of input terminals VINp and VINn, and outputs a differential signal from a pair of output terminals VOUTp and VOUTn.

On the other hand, the input/output circuit IOC separates the constant-current sources CSNa and CSNb, and causes them to operate independently during the single mode that receives the low level differential enable signal DIFEN. Accordingly, the input/output circuit IOC operates as amplifier circuits which receive single-ended signals at the respective input terminals VINp and VINn, and output single-ended signals from the respective output terminals VOUTp and VOUTn. As thus described, a differential signal or a single-ended signal is transmitted to the input lines VINp and VINn and the output lines VOUTp and VOUTn, according to the operation mode (the differential mode or the single mode). Accordingly, a single input/output circuit IOC may be used as an amplifier circuit of the differential signal or an amplifier circuit of the single-ended signal.

Figure 2:
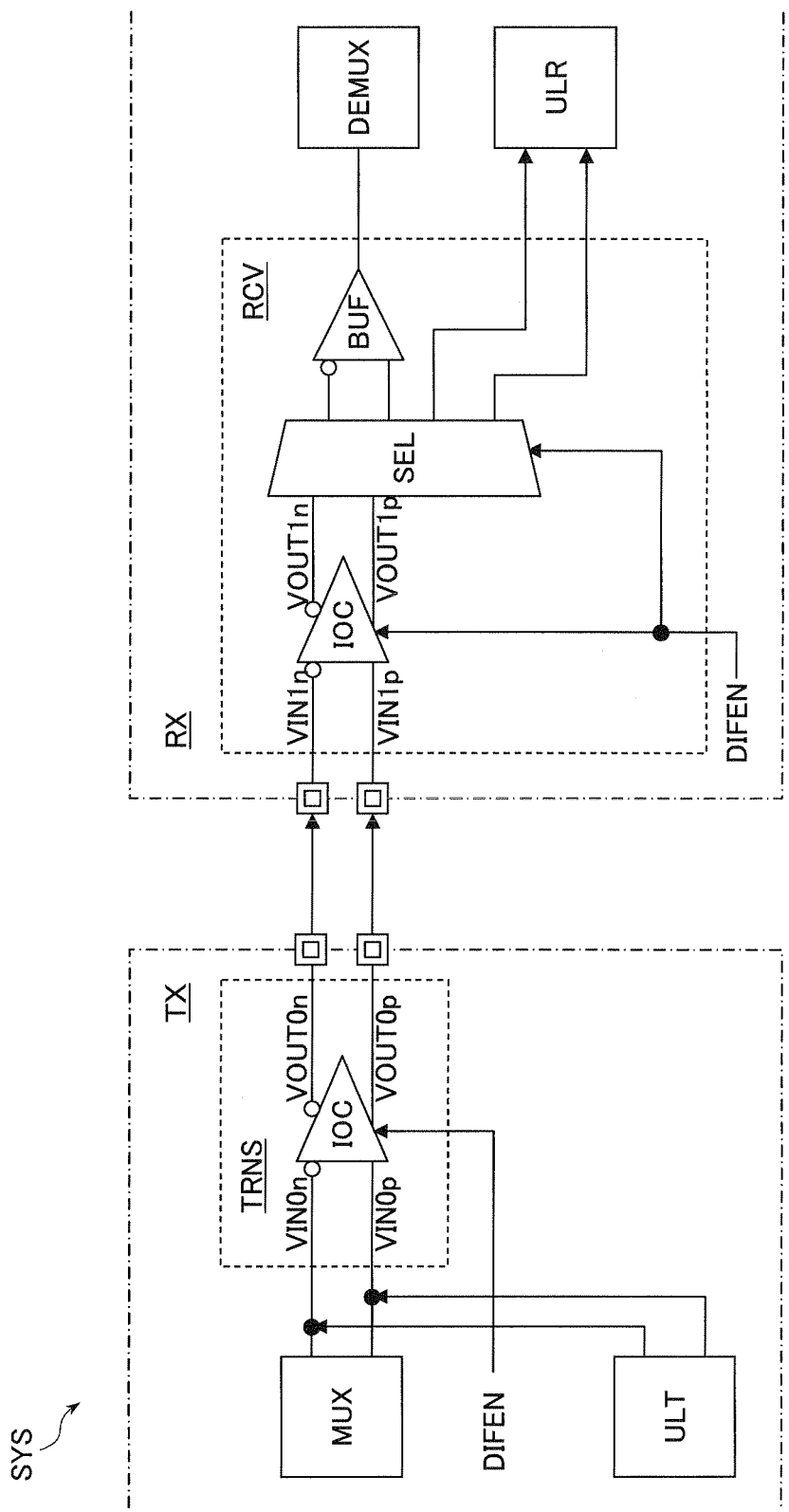
FIG. 2 illustrates an example of a system having the input/output circuit illustrated in FIG. 1 provided in a transmitter device and a receiver device.

FIG. 2 illustrates an example of a system SYS having the input/output circuit IOC illustrated in FIG. 1 provided to a transmitter device TX and a receiver device RX. Although not particular limited thereto, each of the transmitter device TX and the receiver device RX is formed as a semiconductor chip. The system SYS transmits a signal to the receiver device RX from the transmitter device TX using an interface standard such as MIPI (Mobile Industry Processor Interface) or USB (Universal Serial Bus). With such an interface standard, a differential signal such as LVDS (Low Voltage Differential Signal) or a single-ended signal is transmitted according to the operation mode.

For example, the transmitter device TX has a multiplexer MUX which outputs the differential signal, a user logic ULT which outputs the single-ended signal, and a transmitter circuit TRNS including the input/output circuit IOC illustrated in FIG. 1. The multiplexer MUX and the user logic ULT operate exclusively with each other. The multiplexer MUX operates during the differential mode and outputs the differential signal to a pair of input lines VIN0n and VIN0p of the transmitter circuit TRNS. The user logic ULT operates during the single mode and outputs one or two single-ended signals to at least one of the input lines VIN0n and VIN0p of the transmitter circuit TRNS.

The input/output circuit IOC of the transmitter circuit TRNS operates as a driver in a similar manner as described in FIG. 1. The transmitter circuit TRNS outputs complementary or single-phase output signals VOUT0n and VOUT0p to input terminals VIN1n and VIN1p of a receiver circuit RCV via external terminals. Transmitting the differential signal and the single-ended signal using a common signal line reduces the number of signal lines and the number of external terminals, and whereby the cost of the system SYS may be reduced.

For example, the receiver device RX has the receiver circuit RCV, a demultiplexer DEMUX which receives the differential signal, and a user logic ULR which receives the single-ended signal. The receiver circuit RCV has the input/output circuit IOC illustrated in FIG. 1, a selector SEL, and a buffer circuit BUF. The input-output circuit IOC of the receiver circuit RCV operates as a receiver in a similar manner as described in FIG. 1.

While receiving the high level differential enable signal DIFEN, the selector SEL outputs a pair of output signals VOUT1n and VOUT1p (the differential signal) from the input/output circuit IOC to the buffer circuit BUF. While receiving the low level differential enable signal DIFEN, the selector SEL outputs the output signals VOUT1n and VOUT1p (the single-ended signals) from the input/output circuit IOC to the user logic ULR. The buffer circuit BUF converts the differential signal received via the selector SEL into a single-ended signal and outputs it to the demultiplexer DEMUX.

The receiver device RX generates the differential enable signal DIFEN, based on information indicating the operation status of the system SYS. The logic of the differential enable signal DIFEN generated by the receiver device RX is identical to the logic of the differential enable signal DIFEN generated by the transmitter device TX.

Figure 3:
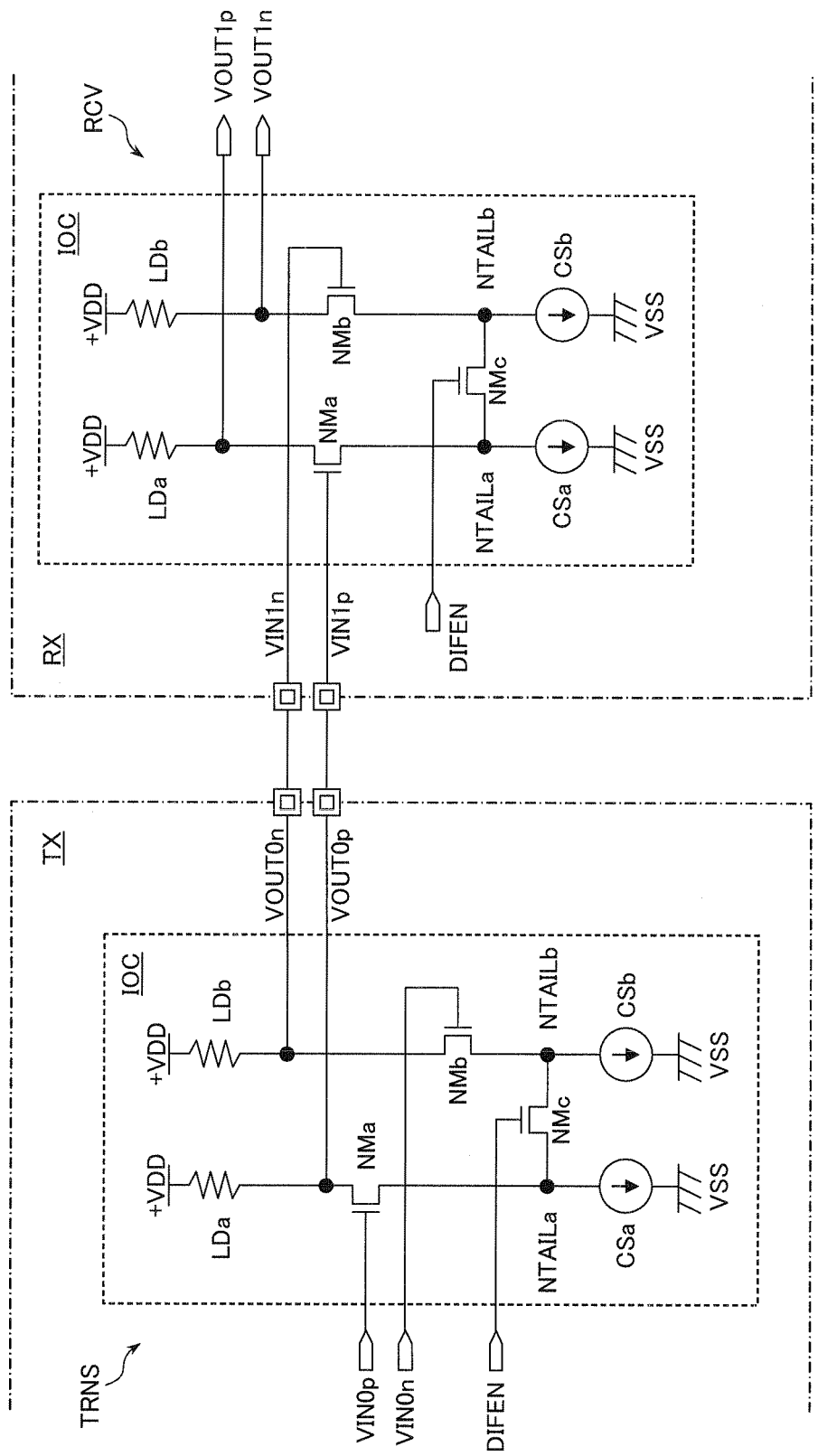
FIG. 3 illustrates an example of a coupling between the input/output circuit of the transmitter device and the input/output circuit of the receiver device illustrated in FIG. 2.

FIG. 3 illustrates an example of a coupling between the input/output circuit IOC of the transmitter device TX and the input/output circuit IOC of the receiver device RX illustrated in FIG. 2. In this example, the drain electrode of the transistor NMa of the transmitter device TX is coupled to the gate electrode VIN1p of the transistor NMa of the receiver device RX via the output line VOUT0p and the input line VIN1p. The drain electrode of the transistor NMb of the transmitter device TX is coupled to the gate electrode VIN1n of the transistor NMb of the receiver device RX via the output line VOUT0n and the input line VIN1n.

In this embodiment, the input/output circuit IOC of the transmitter device TX and the input/output circuit IOC of the receiver device RX may process both the differential signal and the single-ended signal. Therefore, in the system SYS which processes both the differential signal and the single-ended signal in a switching manner, the size of the input/output circuit IOC may be reduced, and the size of the receiver circuit RCV and the transmitter circuit TRNS having the input/output circuit IOC mounted thereon may be reduced. As a result, the cost of the system SYS may be lowered.

Figure 4:
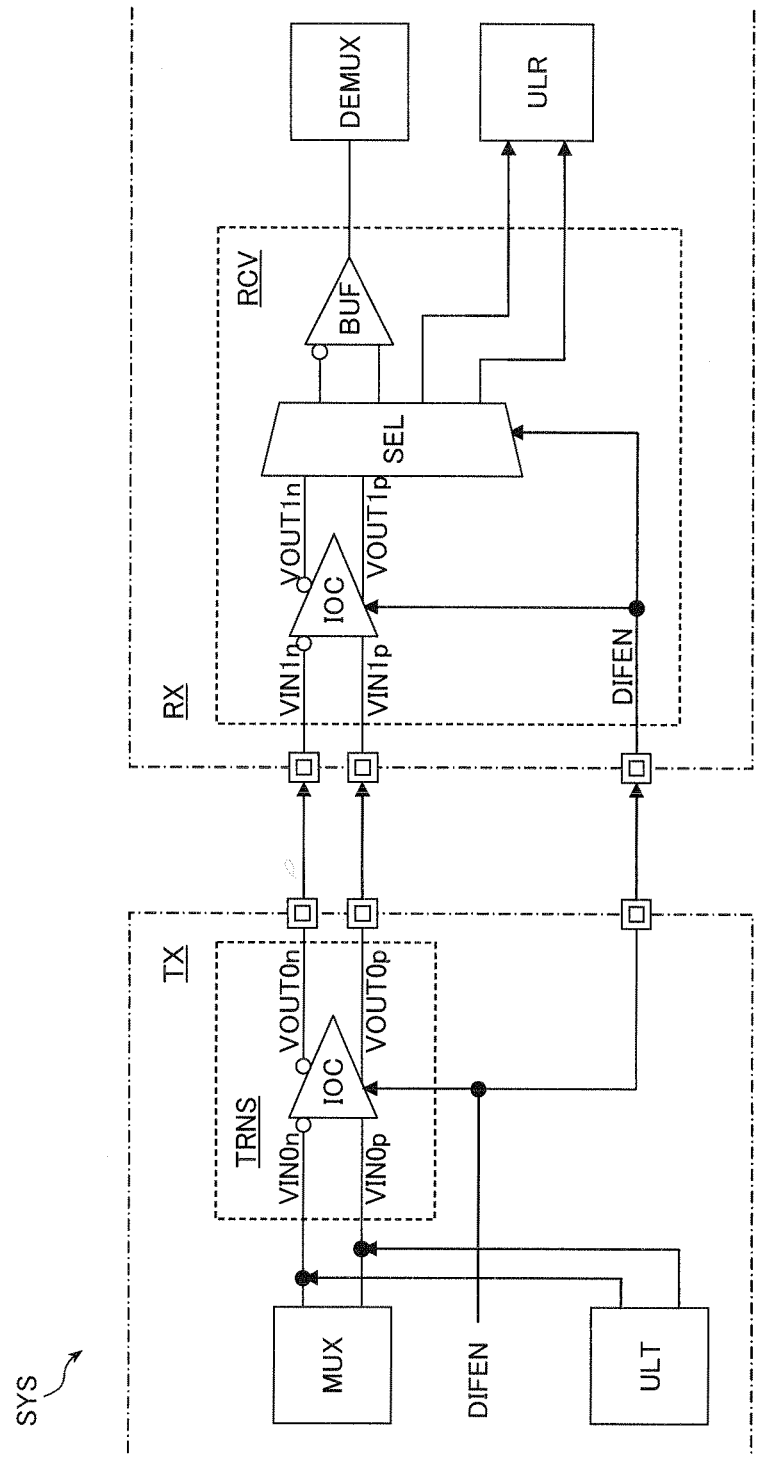
FIG. 4 illustrates an example of a system in another embodiment.

FIG. 4 illustrates an example of a system SYS in another embodiment. The components identical to those described in the above-mentioned embodiment are provided with identical reference symbols and detailed description thereof is omitted. For example, the system SYS has the transmitter device TX and the receiver device RX. In this embodiment, the input/output circuit IOC is identical to that illustrated in FIG. 1. Each of the transmitter device TX and the receiver device RX is formed as a semiconductor chip, although not particularly limited thereto.

In this embodiment, the receiver device RX receives the differential enable signal DIFEN from the transmitter device TX. Therefore, the transmitter device TX has an external terminal which outputs the differential enable signal DIFEN. The receiver device RX has an external terminal which receives the differential enable signal DIFEN. The rest of the configuration of the transmitter device TX and the receiver device RX is similar to that of FIG. 2.

As thus described, this embodiment also brings about a similar effect as that of the above-mentioned embodiment. Furthermore, the size of the receiver device RX may be reduced because it is not necessary to form a circuit in the receiver device RX to generate the differential enable signal DIFEN.

Figure 5:
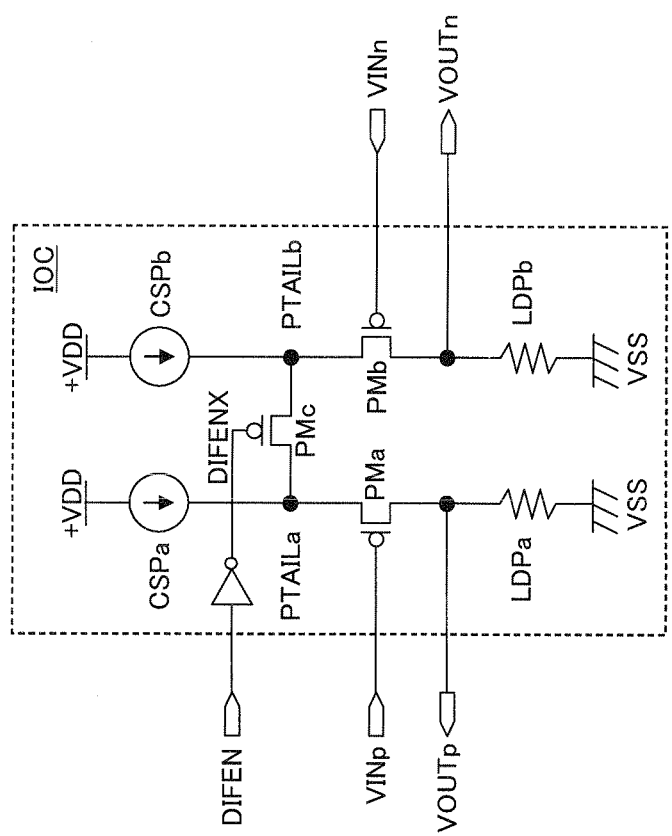
FIG. 5 illustrates an example of an input/output circuit in another embodiment.

FIG. 5 illustrates an example of an input/output circuit IOC in another embodiment. The components identical to those described in the above-mentioned embodiment are provided with identical reference symbols and detailed description thereof is omitted. The input-output circuit IOC has loads LDPa and LDPb, MOS transistors PMa, PMb and PMc, and constant-current sources CSPa and CSPb. The loads LDPa and LDPb are resistor elements, for example. The symbol "PM" of the MOS transistor indicates a p-channel transistor. The load LDPa has its one end coupled to the ground line VSS and the other end coupled to the output line VOUTp. The load LDPb has its one end coupled to the ground line VSS and the other end coupled to the output line VOUTn.

The MOS transistor PMa has its drain electrode coupled to the other end of the load LDPa, its gate electrode coupled to the input line VINp, and its source electrode coupled to the constant-current source CSPa via a node PTAILa. The MOS transistor PMb has its drain electrode coupled to the other end of the load LDPb, its gate electrode coupled to the input line VINn, and its source electrode coupled to the constant-current source CSPb via a node PTAILb.

The transistor PMc has one of its source electrode and drain electrode coupled to the source electrode of the MOS transistor PMa, and the other of the source electrode and drain electrode coupled to the source electrode of the MOS transistor PMb. In addition, the transistor PMc has its gate electrode coupled to a differential enable signal line DIFENX having an inverted logic level of the differential enable signal line DIFEN. The constant-current source CSPa is coupled between the source electrode of the MOS transistor PMa and the power supply Line+VDD. The constant-current source CSPb is coupled between the source electrode of the MOS transistor PMb and the power supply Line+VDD.

In this embodiment, the input/output circuit IOC also couples the constant-current sources CSPa and CSPb together during the differential mode that receives the high level differential enable signal DIFEN, and causes them to operate commonly as a single constant-current source. Accordingly, the input/output circuit IOC operates as a differential amplifier circuit which receives a differential signal at the input terminals VINp and VINn, and outputs a differential signal from the output terminals VOUTp and VOUTn.

On the other hand, the input/output circuit IOC separates the constant-current sources CSPa and CSPb, and causes them to operate independently during the single mode that receives the low level differential enable signal DIFEN. Accordingly, the input/output circuit IOC operates as amplifier circuits which receive single-ended signals at the respective input terminals VINp and VINn, and output single-ended signals from the respective output terminals VOUTp and VOUTn. In other words, a single input/output circuit IOC may be used as an amplifier circuit of a differential signal or an amplifier circuit of a single-ended signal. The input/output circuit IOC illustrated in FIG. 5 is mounted on the transmitter circuit TRNS and the receiver circuit RCV illustrated in FIGS. 2 and 4, for example. As thus described, this embodiment also brings about a similar effect as that of the above-mentioned embodiments.

Figure 6:
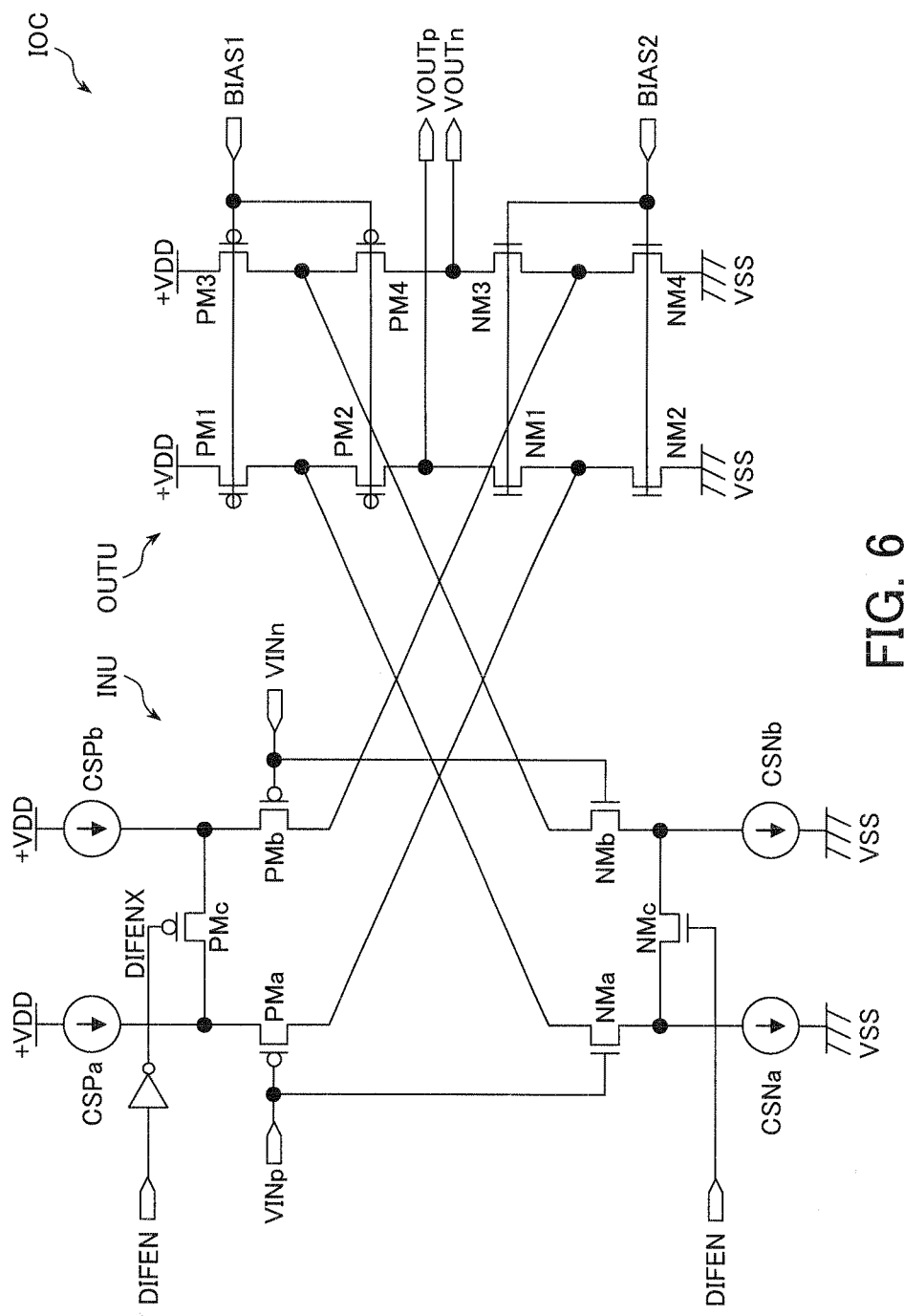
FIG. 6 illustrates an example of an input/output circuit in another embodiment.

FIG. 6 illustrates an example of an input/output circuit IOC in another embodiment. The components identical to those described in the above-mentioned embodiment are provided with identical reference symbols and detailed description thereof is omitted. The input/output circuit IOC, formed as a cascaded amplifier circuit, has an input unit INU and an output unit OUTU.

The input unit INU has the p-channel MOS transistors PMa, PMb and PMc, the n-channel MOS transistors NMa, NMb and NMc, and the constant-current sources CSPa, CSPb, CSNa and CSNb. The coupling relation of the MOS transistors NMa, NMb and NMc, and the current sources CSNa and CSNb is similar to that of FIG. 1. The coupling relation of the MOS transistors PMa, PMb and PMc, and the current sources CSPa and CSPb is similar to that of FIG. 5.

The electrical characteristic of the MOS transistors PMa, PMb, PMc, NMa, NMb and NMc, and the current sources CSPa, CSPb, CSNa and CSNb may be different from the electrical characteristic of respective elements of FIGS. 1 and 5. The gate electrodes of the transistors PMa and NMa are coupled to the input line VINp. The gate electrodes of the transistors PMb and NMb are coupled to the input line VINn.

The output unit OUTU has transistors PM1, PM2, NM1 and NM2 which are serially-coupled between the power supply Line+VDD and the ground line VSS, and transistors PM3, PM4, NM3 and NM4 which are serially-coupled between the power supply Line+VDD and the ground line VSS.

The gate electrodes of the transistors PM1-4 are coupled to a bias line BIAS1. The transistors PM1-4 function as resistors by receiving a bias voltage BIAS1. The gate electrodes of the transistors NM1-4 are coupled to a bias line BIAS2. The transistors NM1-4 function as resistors by receiving a bias voltage BIAS2.

The drain electrodes of the MOS transistors PM2 and NM1 are coupled to the output line VOUTp. The drain electrodes of the MOS transistors PM4 and NM3 are coupled to the output line VOUTn. The source electrode of the MOS transistor PM2 is coupled to the drain electrode of the MOS transistor NMa. The source electrode of the MOS transistor PM4 is coupled to the drain electrode of the MOS transistor NMb. The source electrode of the MOS transistor NM1 is coupled to the drain electrode of the MOS transistor PMa. The source electrode of the MOS transistor NM3 is coupled to the drain electrode of the MOS transistor PMb.

The input/output circuit IOC illustrated in FIG. 6 is mounted on the transmitter circuit TRNS and the receiver circuit RCV illustrated in FIGS. 2 and 4, for example. The bias voltages BIAS1-2 are generated in the transmitter device TX and the receiver device RX, although not particularly limited thereto. In the differential mode in which the differential enable signal DIFEN is set to a high level, the differential signal VINp and VINn amplified in the input unit INU is output as the differential signal VOUTp and VOUTn. On the other hand, in the single mode in which the differential enable signal DIFEN is set to a low level, the single-ended signals VINp and VINn amplified in the input unit INU are output as the single-ended signals VOUTp and VOUTn, respectively. As thus described, this embodiment also brings about a similar effect as that of the above-mentioned embodiments. Furthermore, the size of the receiver circuit RCV and transmitter circuit TRNS may also be reduced when forming the input/output circuit IOC as a cascaded amplifier circuit.

Figure 7:
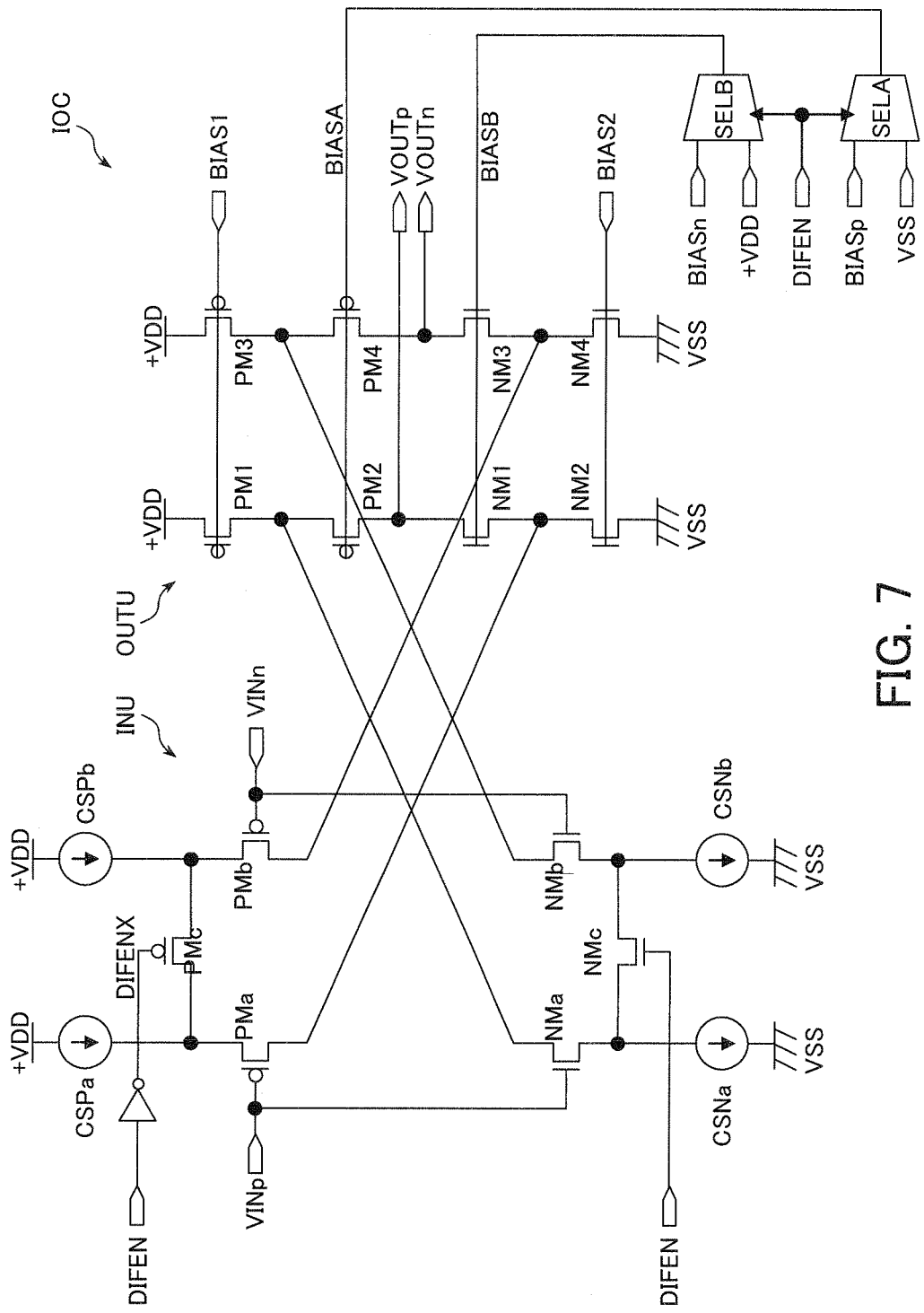
FIG. 7 illustrates an example of an input/output circuit in another embodiment.

FIG. 7 illustrates an example of an input/output circuit IOC in another embodiment. The components identical to those described in the above-mentioned embodiment are provided with identical reference symbols and detailed description thereof is omitted. The input/output circuit IOC is mounted on the transmitter circuit TRNS and the receiver circuit RCV illustrated in FIGS. 2 and 4, for example. The output unit OUTU of the input/output circuit IOC is different from that of FIG. 6. The output unit OUTU receives a bias voltage BIASA output from a selector SELA at the gate electrodes of the transistors PM2 and PM4, and receives a bias voltage BIASB output from a selector SELB at the gate electrodes of the transistors NM1 and NM3.

The selector SELA outputs a bias voltage BIASp as the bias voltage BIASA during the differential mode in which the differential enable signal DIFEN is at a high level. The selector SELA outputs the ground voltage VSS as the bias voltage BIASA during the single mode in which the differential enable signal DIFEN is at a low level. For example, bias voltage BIASp, which is a value higher than the ground voltage VSS, is generated in the transmitter device TX and the receiver device RX.

The selector SELB outputs a bias voltage BIASn as the bias voltage BIASB during the differential mode. The selector SELB outputs the power supply voltage+VDD as the bias voltage BIASB during the single mode. For example, the bias voltage BIASn, which is a value lower than the power supply voltage+VDD, is generated in the transmitter device TX and the receiver device RX.

In this embodiment, the amplitudes of the output signals VOUTp and VOUTn may be changed according to the operation mode by changing the values of the bias voltages BIASA and BIASB according to the operation mode. For example, the amplitudes of the output signals VOUTp and VOUTn are set during the differential mode to be smaller than the difference between the power supply voltage+VDD and the ground voltage VSS (small amplitude). The amplitudes of the output signals VOUTp and VOUTn are set during the single mode to a value identical to the difference between the power supply voltage+VDD and the ground voltage VSS (full amplitude). As thus described, this embodiment also brings about a similar effect as that of the above-mentioned embodiments.

Figure 8:
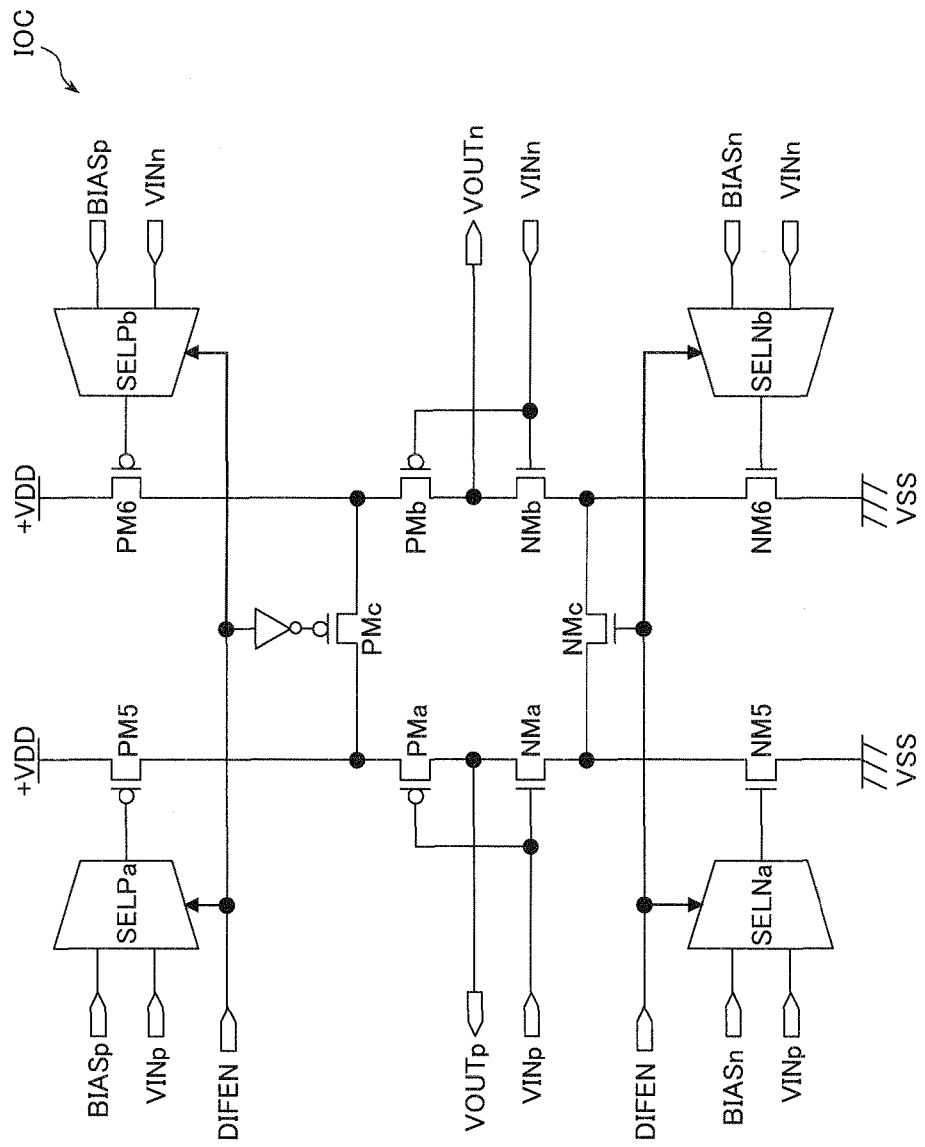
FIG. 8 illustrates an example of an input/output circuit in another embodiment.

FIG. 8 illustrates an example of an input/output circuit IOC in another embodiment. The components identical to those described in the above-mentioned embodiment are provided with identical reference symbols and detailed description thereof is omitted. The input/output circuit IOC is mounted on the transmitter circuit TRNS and the receiver circuit RCV illustrated in FIGS. 2 and 4, for example.

The input/output circuit IOC has p-channel transistors PMa, PMb, PMc, PM5 and PM6, n-channel transistors NMa, NMb, NMc, NM5 and NM6, and selectors SELPa, SELPb, SELNa and SELNb. The transistors PM5, PMa, NMa and NM5 are serially-coupled between the power supply Line+VDD and the ground line VSS. The transistors PM6, PMb, NMb and NM6 are serially-coupled between the power supply Line+VDD and the ground line VSS. The coupling relation of the transistors PMa, PMb and PMc is similar to that of FIG. 5. The coupling relation of transistors NMa, NMb and NMc is similar to that of FIG. 1.

The selector SELPa outputs the bias voltage BIASp to the gate electrode of the transistor PM5 during the differential mode, and outputs the input signal VINp to the gate electrode of the transistor PM5 during the single mode. The selector SELPb outputs the bias voltage BIASp to the gate electrode of the transistor PM6 during the differential mode, and outputs the input signal VINn to the gate electrode of the transistor PM6 during the single mode. The selector SELNa outputs the bias voltage BIASn to the gate electrode of the transistor NM5 during the differential mode, and outputs the input signal VINp to the gate electrode of the transistor NM5 during the single mode. The selector SELNb outputs the bias voltage BIASn to the gate electrode of the transistor NM6 during the differential mode, and outputs the input signal VINn to the gate electrode of the transistor NM6 during the single mode. The values of the bias voltages BIASp and BIASn are identical to those of the bias voltages BIASp and BIASn of FIG. 7, although not particularly limited thereto.

The input/output circuit IOC outputs the small-amplitude differential output signal VOUTp and VOUTn during the differential mode in which the differential enable signal DIFEN is at a high level. The input/output circuit IOC operates as a pair of cascades type CMOS inverters during the single mode in which the differential enable signal DIFEN is at a low level, and outputs the full-amplitude, single-ended output signals VOUTp and VOUTn. As thus described, this embodiment also brings about a similar effect as that of the above-mentioned embodiments.

Figure 9:
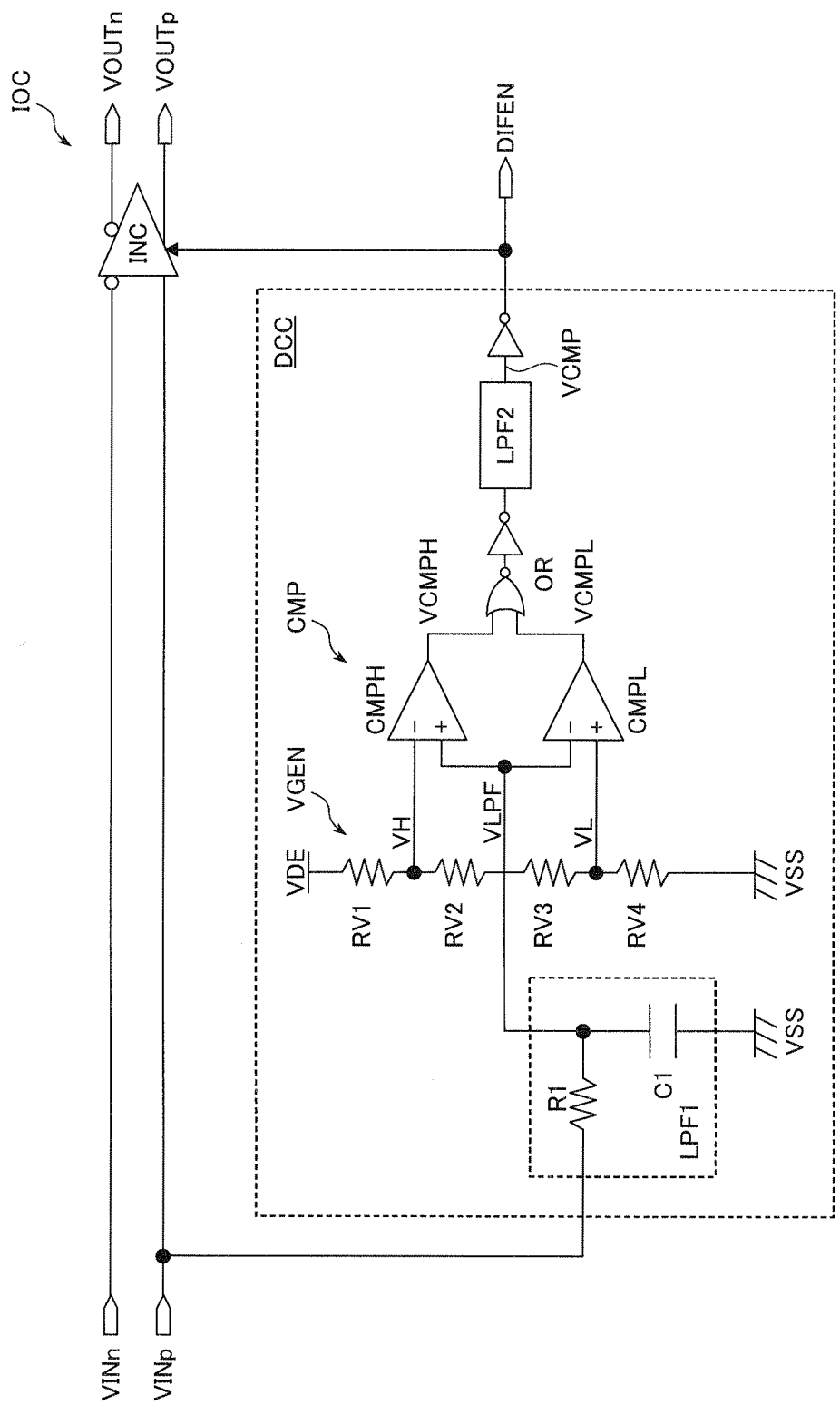
FIG. 9 illustrates an example of an input/output circuit in another embodiment.

FIG. 9 illustrates an example of an input/output circuit IOC in another embodiment. The components identical to those described in the above-mentioned embodiment are provided with identical reference symbols and detailed description thereof is omitted. The input/output circuit IOC has an input circuit INC with an identical circuit configuration to the input/output circuit IOC illustrated in any one of FIGS. 1, 5 to 8, and a decision circuit DCC. The decision circuit DCC receives the input signal VINp and generates the differential enable signal DIFEN. In other words, the input/output circuit IOC of this embodiment automatically determines the operation mode and generates the differential enable signal DIFEN.

Figure 11:
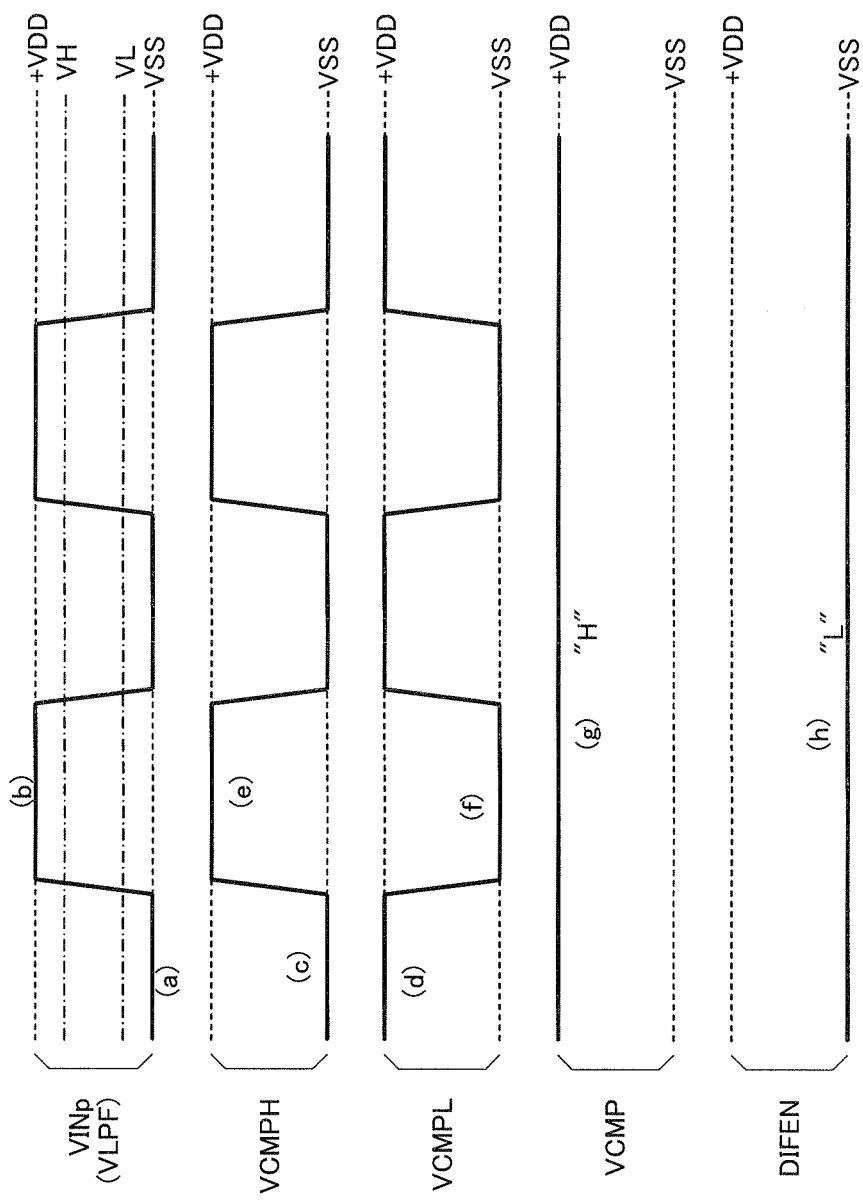
FIG. 11 illustrates an example of an operation of a decision circuit when the system illustrated in FIG. 9 is set to a single mode.

The decision circuit DCC has low pass filters LPF1-2, a voltage generation unit VGEN, a comparison unit CMP, and an OR circuit. The low pass filter LPF1 has a resistor R1 and a capacitor C1, smoothes the voltage of the input signal VINp, and generates a voltage VLPF. The voltage generation unit VGEN has a plurality of resistors RV1-RV4 which are coupled between a power supply line VDE and the ground line VSS. For example, the value of the power supply line VDE is identical to that of the power supply voltage+VDD. The voltage generation unit VGEN generates a voltage VH which is lower than the power supply voltage+VDD and a voltage VL which is higher than the ground voltage VSS. For example, as illustrated in FIG. 11, the voltage VH is lower than the high level voltage of the input signal VINp transmitted during the single mode, and the voltage VL is higher than the low level voltage of the input signal VINp transmitted during the single mode.

The comparison unit CMP has comparators CMPH and CMPL. The comparator CMPH outputs a high level comparison result signal VCMPH when the voltage VLPF is higher than the voltage VH, and outputs a low level comparison result signal VCMPH when the voltage VLPF is lower than the voltage VH. The comparator CMPL outputs a low level comparison result signal VCMPL when the voltage VLPF is higher than the voltage VL, and outputs a high level comparison result signal VCMPL when the voltage VLPF is lower than the voltage VL.

The OR circuit outputs a high level comparison result signal VCMP via the low pass filter LPF2 when either one of the comparison result signals VCMPH and VCMPL is at a high level. In addition, the OR circuit outputs a low level comparison result signal VCMP via the low pass filter LPF2 when the comparison result signals VCMPH and VCMPL are both at a low level. The low pass filter LPF2 is a circuit similar to the low pass filter LPF1, although not particularly limited thereto.

When a hazard occurs in the output of the OR circuit due to skew of the comparison result signals VCMPH and VCMPL, the low pass filter LPF2 prevents the hazard from being transmitted to the comparison result signal VCMP. In other words, the low pass filter LPF2 prevents malfunction of the decision circuit DCC. The decision circuit DCC inverts the logic level of the comparison result signal VCMP and outputs it as the differential enable signal DIFEN.

Figure 10:
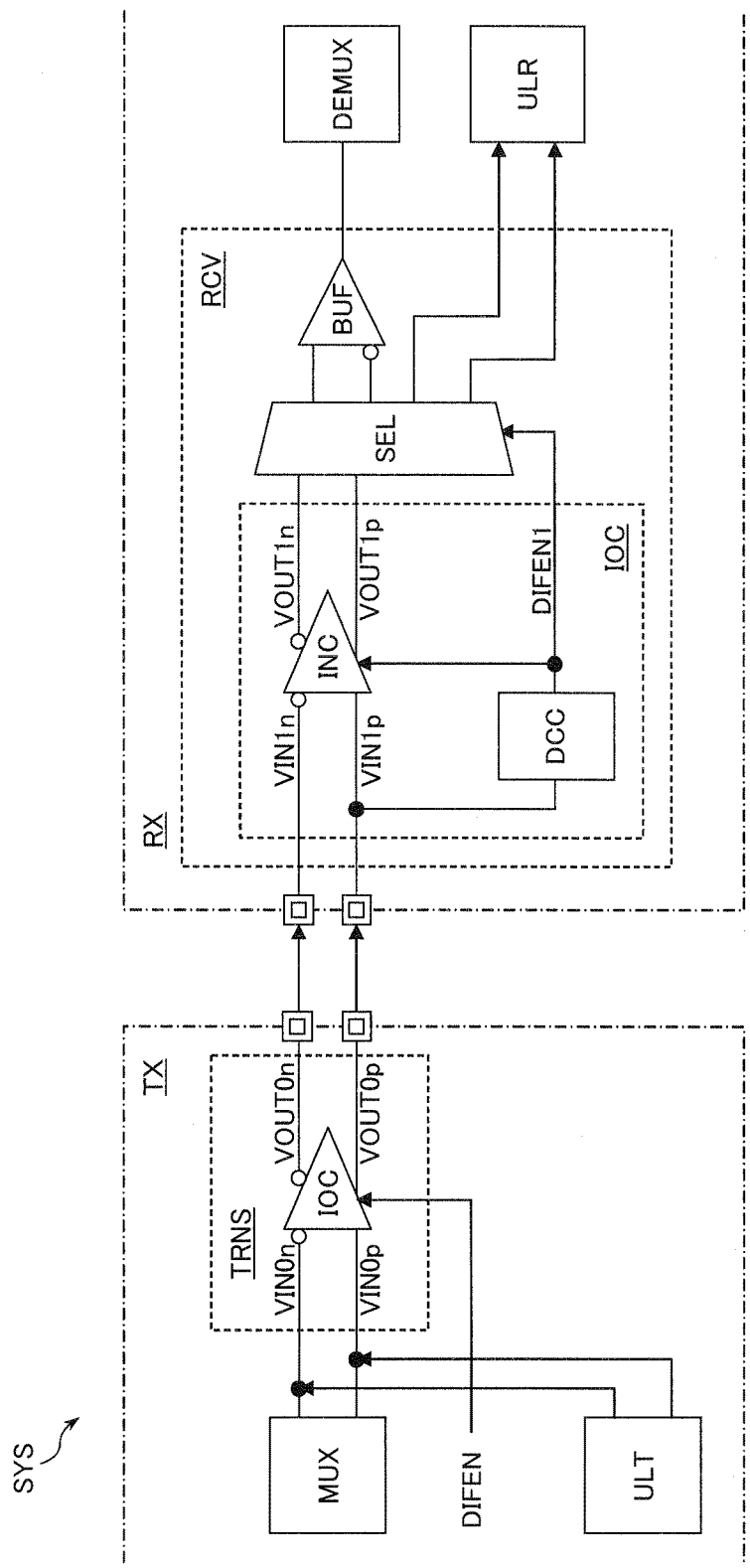
FIG. 10 illustrates an example of a system having the input/output circuit illustrated in FIG. 9 provided in a receiver device.

FIG. 10 illustrates an example of a system having the input/output circuit IOC illustrated in FIG. 9 provided in the receiver device RX. The transmitter device TX is identical to that of FIG. 2. The receiver device IOC has the input/output circuit IOC illustrated in FIG. 9, instead of the input/output circuit IOC illustrated in FIG. 2. In other words, the receiver circuit RCV automatically generates the differential enable signal DIFEN, based on an input signal VIN1$p$ received from the transmitter device TX. The rest of the configuration of the receiver device RX is identical to that of FIG. 2.

FIG. 11 illustrates an example of an operation of the decision circuit DCC when the system SYS illustrated in FIG. 9 is set to the single mode. In the single mode, the high level of the input signal VIN1$p$ is set to the power supply voltage+VDD which is higher than the voltage VH (FIG. 11($a$)), whereas the low level of the input signal VIN1$p$ is set to the ground voltage VSS which is lower than the voltage VL (FIG. 11($b$)). That is, in a single mode, the input signal VIN1$p$ oscillates with full amplitude. For example, the frequency of the input signals VIN1$p$ and VIN1$n$ in the single mode is 10 MHz.

The comparison result signal VCMPH is set to a low level and the comparison result signal VCMPL is set to a high level during a period while the input signal VINp is at a low level (FIG. 11($c, d$)). The comparison result signal VCMPH is set to a high level and the comparison result signal VCMPL is set to a low level during a period while the input signal VINp is at a high level (FIG. 11($e, f$)). Therefore, the comparison result signal VCMP is fixed to a high level H (FIG. 11($g$)), and the differential enable signal DIFEN is fixed to a low level L (FIG. 11($h$)). In other words, the receiver circuit RCV may automatically determine that the input signal VIN1$p$ is transmitted in the single mode.

Figure 12:
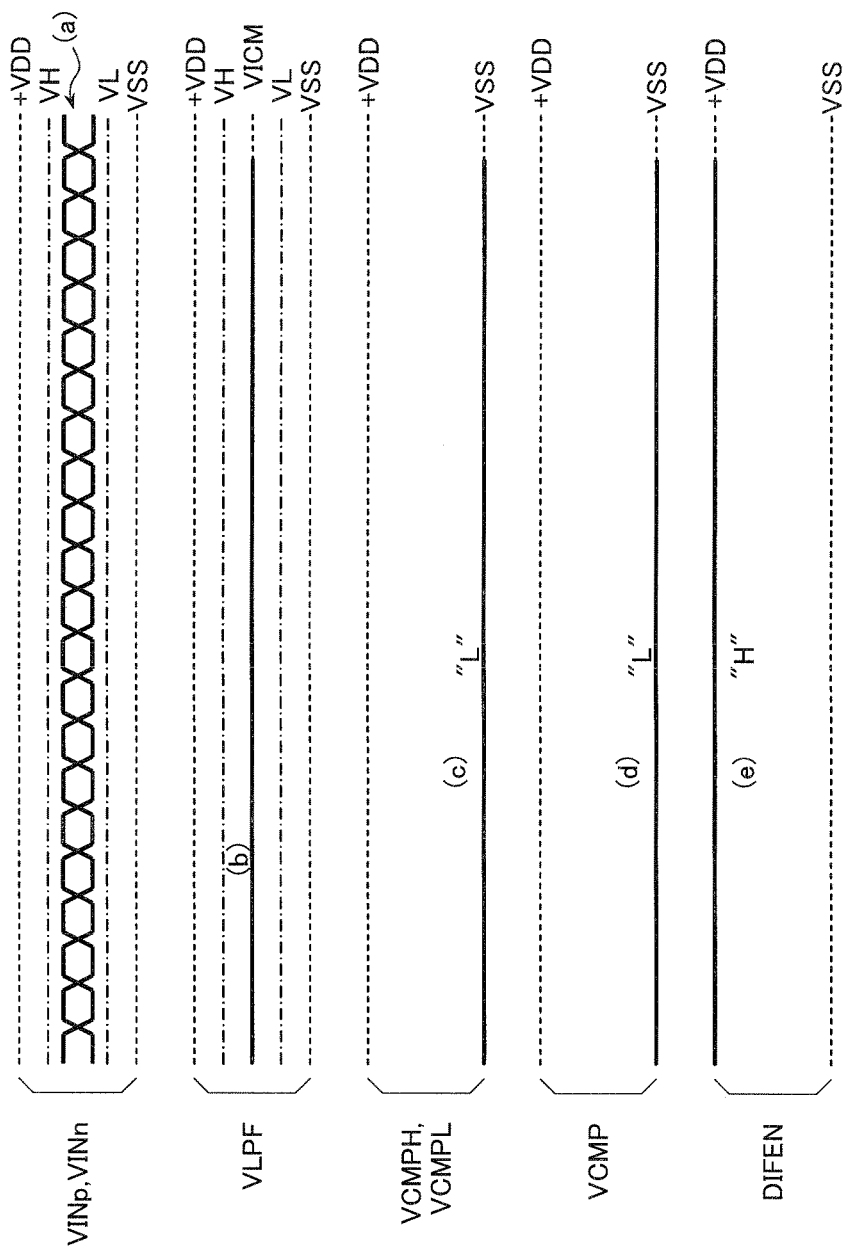
FIG. 12 illustrates an example of an operation of a decision circuit when the system illustrated in FIG. 9 is set to a differential mode.

FIG. 12 illustrates an example of an operation of the decision circuit DCC when the system SYS illustrated in FIG. 9 is set to the differential mode. In the differential mode, the high level of the input signal VIN1$p$ is set to a value lower than the voltage VH, whereas the low level of the input signal VIN1$p$ is set to a value higher than the voltage VL (FIG. 12($a$)), although not particularly limited thereto. That is, in the differential mode, the amplitude of the input signal VIN1$p$ is small. For example, the frequency of the input signals VIN1$p$ and VIN1$n$ in the differential mode is 1 GHz.

In the differential mode, the input signal VINp having a higher frequency than the cutoff frequency of the low pass filter LPF1 (e.g., 100 MHz) is transmitted. Therefore, the low pass filter LPF1 illustrated in FIG. 9 sets the value of the voltage VLPF to an intermediate voltage VICM (DC voltage) in between the voltages VH and HL (FIG. 12($b$)). Therefore, the comparison result signals VCMPH and VCMPL are both set to the low level L (FIG. 12($c$)). As a result, the comparison result signal VCMP is fixed to the low level L (FIG. 12($d$)), and the differential enable signal DIFEN is fixed to the high level H (FIG. 12($e$)). In other words, the receiver circuit RCV may automatically determine that the input signal VIN1$p$ is transmitted in the differential mode.

As thus described, this embodiment also brings about a similar effect as that of the above-mentioned embodiments. Furthermore, it becomes unnecessary to output information indicating the operation mode to the receiver device RX from the transmitter device TX, by providing the receiver device RX with the decision circuit DCC which determines the operation mode and generates the differential enable signal DIFEN. Therefore, the number of external terminals of the transmitter device TX and the receiver device RX may be reduced, and the number of signal lines wired between the transmitter device TX and the receiver device RX may be reduced. As a result, the cost of the system SYS may be reduced.

Figure 13:
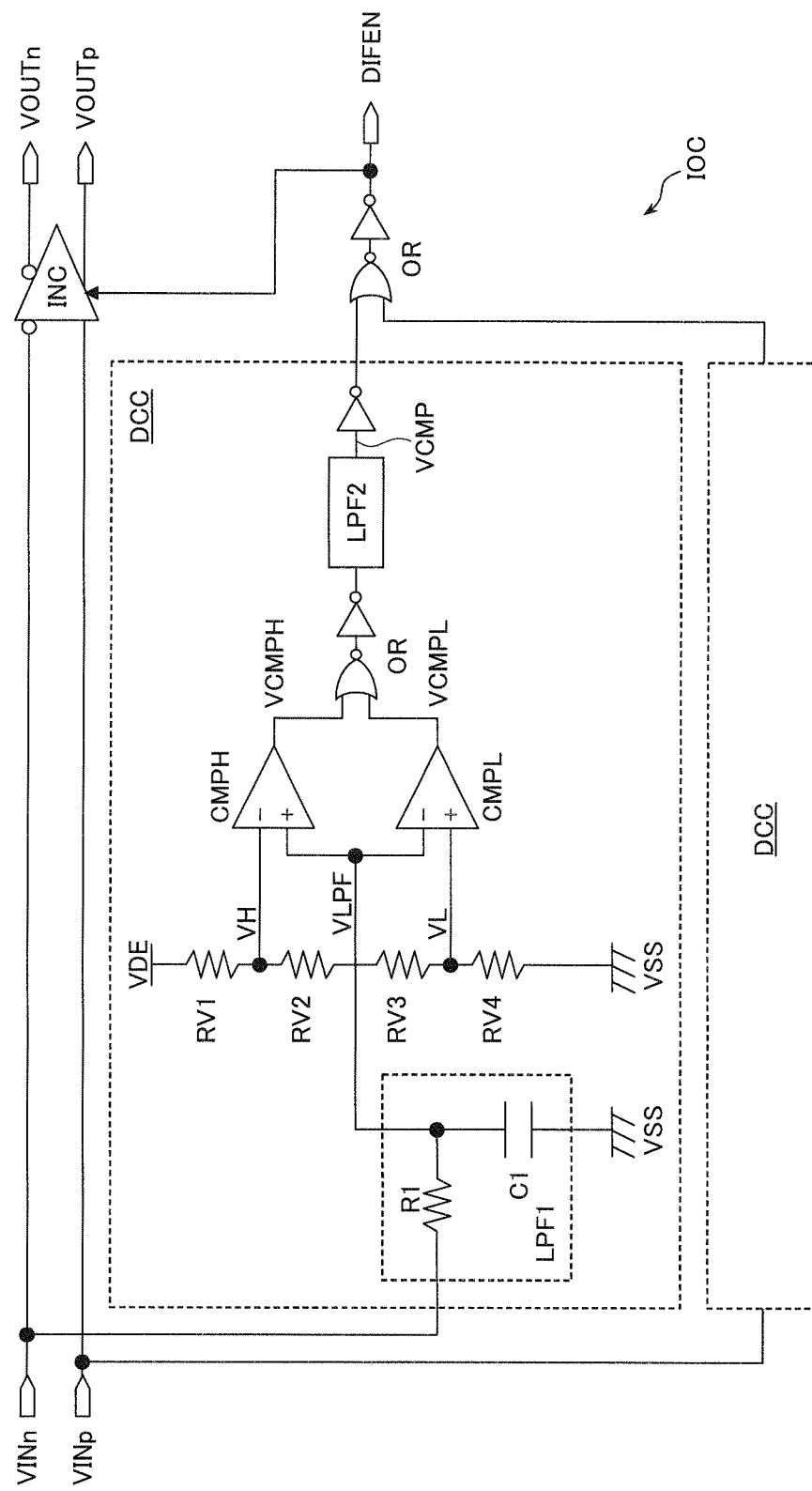
FIG. 13 illustrates an example of an input/output circuit in another embodiment.

FIG. 13 illustrates an example of an input/output circuit IOC in another embodiment. The components identical to those described in the above-mentioned embodiment are provided with identical reference symbols and detailed description thereof is omitted. In this embodiment, the input/output circuit IOC has the decision circuit DCC not only at the input signal VIN1$p$ side but also at the input signal VIN1$n$ side. Outputs of the two decision circuits DCC are output as the differential enable signal DIFEN via the OR circuit. The rest of the configuration of the input/output circuit IOC is similar to that of FIG. 9. As thus described, this embodiment also brings about a similar effect as that of the above-mentioned embodiments. Furthermore, the two decision circuits DCC allow the operation mode to be reliably determined. Particularly, in the single mode, the operation mode may be reliably determined when the single-ended signal is transmitted to only one of the input lines VIN1$p$ and VIN1$n$.

Figure 14:
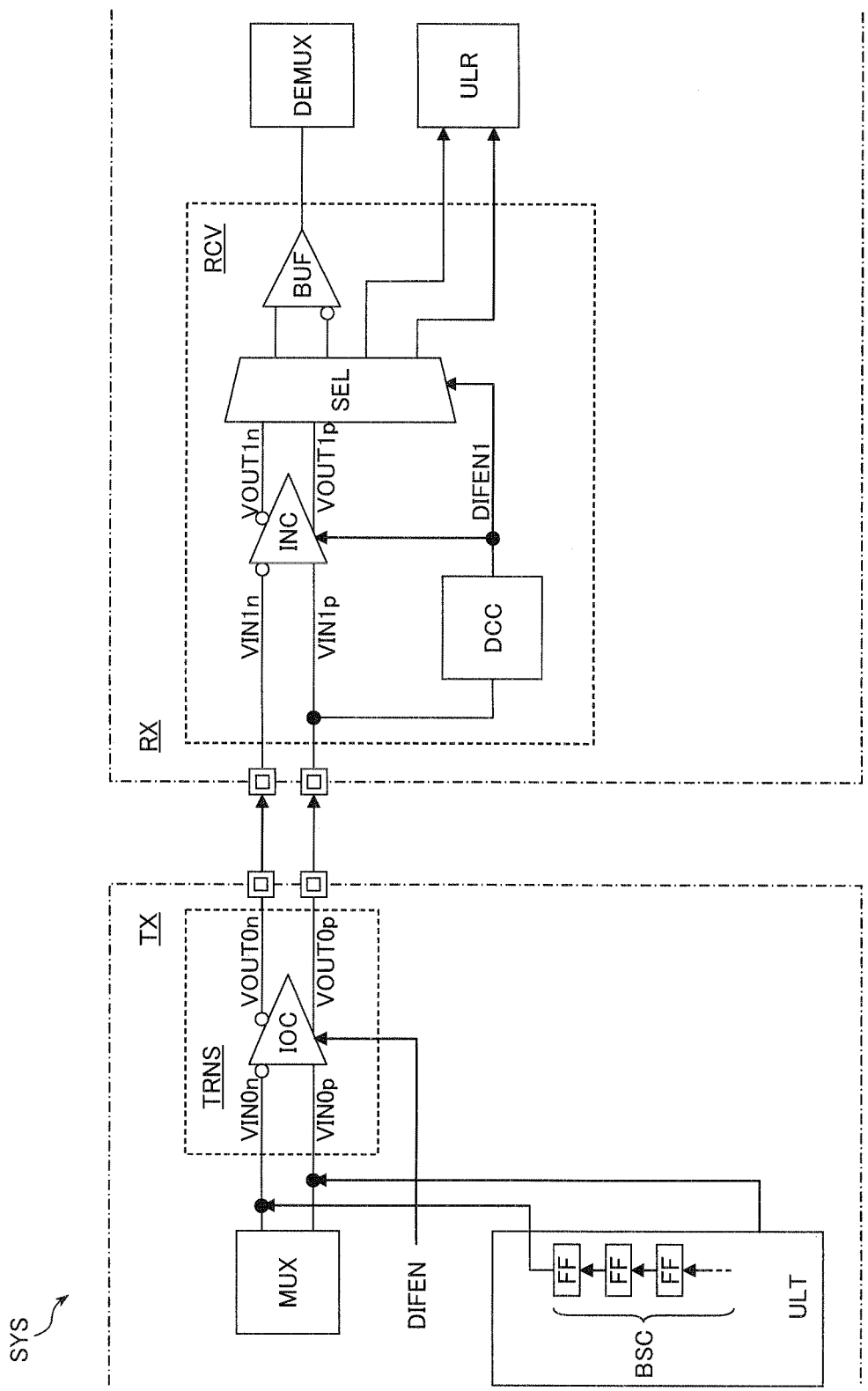
FIG. 14 illustrates an example of a system in another embodiment.

FIG. 14 illustrates an example of a system SYS in another embodiment. The components identical to those described in the above-mentioned embodiment are provided with identical reference symbols and detailed description thereof is omitted. In this embodiment, the user logic ULT of the transmitter device TX has a test circuit BSC which performs a boundary scan test standardized by JTAG (Joint Test Action Group; IEEE 1149.1). The test circuit BSC has a serially-coupled flip-flop circuit FF for sequentially transferring test data and the result of test. For example, the output of the test circuit BSC is coupled to the input line VIN0$n$. The rest of the configuration of the transmitter device TX and the receiver device RX is identical to that of FIG. 10. The receiver device RX may be the receiver device RX illustrated in FIG. 2 or 4.

In this embodiment, the operation mode is set to the single mode when performing an interconnection test between the transmitter device TX and the receiver device RX using a low speed signal. Accordingly, the interconnection test may be performed using the signal line through which the differential signal VOUT0$n$ and VOUT0$p$ is transmitted. As thus described, this embodiment also brings about a similar effect as that of the above-mentioned embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. An input/output circuit, comprising:
a first load having one end coupled to a first standard voltage line;
a first MOS transistor having a drain electrode coupled to another end of the first load;
a second load having one end coupled to the first standard voltage line;

a second MOS transistor having a drain electrode coupled to another end of the second load;

a third MOS transistor having a source electrode coupled to one of a source electrode of the first MOS transistor and a source electrode of the second MOS transistor, a drain electrode coupled to another of the source electrode of the first MOS transistor and the source electrode of the second MOS transistor, and a gate electrode configured to receive a control signal indicating one of a differential mode and a single mode, a gate electrode of the first MOS transistor and a gate electrode of the second MOS transistor receiving a differential signal in the differential mode, at least at one of the gate electrode of the first MOS transistor and the gate electrode of the second MOS transistor receiving a single-ended signal in the single mode, the third MOS transistor being configured to couple the source electrode of the first MOS transistor and the source electrode of the second MOS transistor in the differential mode and to decouple the source electrode of the first MOS transistor and the source electrode of the second MOS transistor in the single mode;

a first constant-current source coupled between the source electrode of the first MOS transistor and a second standard voltage line; and a second constant-current source coupled between the source electrode of the second MOS transistor and the second standard voltage line.

2. The input/output circuit according to claim 1, wherein the first, second, and third MOS transistors are n-channel transistors.

3. The input/output circuit according to claim 1, wherein the first, second, and third MOS transistor are p-channel transistors.

4. The input/output circuit according to claim 1, wherein a pair of input signals is input to the gate electrode of the first MOS transistor and the gate electrode of the second MOS transistor, and a pair of output signals is output from the drain electrode of the first MOS transistor and the drain electrode of the second MOS transistor.

5. The input/output circuit according to claim 1, wherein a pair of differential output signals is output from the drain electrode of the first MOS transistor and the drain electrode of the second MOS transistor, by the third MOS transistor being switched into an on state by the control signal, and the single-ended signal is output from at least one of the drain electrode of the first MOS transistor and the drain electrode of the second MOS transistor, by the third MOS transistor being switched into an off state by the control signal.

6. The input/output circuit according to claim 5, further comprising a decision circuit which determines whether the pair of input signals is a differential signal or single-ended signals, and outputs the control signal according to a result being determined.

7. The input/output circuit according to claim 6, wherein the decision circuit outputs a control signal which switches the third transistor into the on state when determining that the pair of input signals is the differential signal, and outputs a control signal which switches the third transistor into the off state when determining that the pair of input signals is the single-ended signals.

8. A system, comprising a transmitter device having a transmitter circuit including:

a first load having one end coupled to a first standard voltage line;

a first MOS transistor having a drain electrode coupled to another end of the first load;

a second load having one end coupled to the first standard voltage line;

a second MOS transistor having a drain electrode coupled to another end of the second load;

a third MOS transistor having a source electrode coupled to one of a source electrode of the first MOS transistor and a source electrode of the second MOS transistor, a drain electrode coupled to another of the source electrode of the first MOS transistor and the source electrode of the second MOS transistor, and a gate electrode configured to receive a first control signal indicating one of a differential mode a single mode, a gate electrode of the first MOS transistor and a gate electrode of the second MOS transistor receiving a differential signal in the differential mode, at least at one of the gate electrode of the first MOS transistor and the pate electrode of the second MOS transistor receiving a single-ended signal in the single mode, the third MOS transistor being configured to couple the source electrode of the first MOS transistor and the source electrode of the second MOS transistor in the differential mode and to decouple the source electrode of the first MOS transistor and the source electrode of the second MOS transistor in the single mode;

a first constant-current source coupled between the source electrode of the first MOS transistor and a second standard voltage line; and a second constant-current source coupled between the source electrode of the second MOS transistor and the second standard voltage line, and a receiver device having a receiver circuit including:

a third load having one end coupled to a third standard voltage line;

a forth MOS transistor having a drain electrode coupled to another end of the third load;

a forth load having one end coupled to the third standard voltage line;

a fifth MOS transistor having a drain electrode coupled to another end of the forth load;

a sixth MOS transistor having a source electrode coupled to one of a source electrode of the fourth MOS transistor and a source electrode of the fifth MOS transistor, a drain electrode coupled to another of the source electrode of the fourth MOS transistor and the source electrode of the fifth MOS transistor, and a gate electrode configured to receive a second control signal indicating one of the differential mode and the single mode, a gate electrode of the fourth MOS transistor and a gate electrode of the fifth MOS transistor receiving a differential signal in the differential mode, at least at one of the gate electrode of the fourth MOS transistor and the gate electrode of the fifth MOS transistor receiving a single-ended signal in the single mode, the six MOS transistor being configured to couple the source electrode of the fourth MOS transistor and the source electrode of the fifth MOS transistor in the differential mode and to decouple the source electrode of the fourth MOS transistor and the source electrode of the fifth MOS transistor in the single mode;

a third constant-current source coupled between the source electrode of the fourth MOS transistor and a fourth standard voltage line; and a fourth constant-current source coupled between the source electrode of the fifth MOS transistor and the fourth standard voltage line.

9. The system according to claim 8, wherein the drain electrode of the first MOS transistor and the gate electrode of the fourth MOS transistor are coupled, and the drain electrode of the second MOS transistor and the gate electrode of the fifth MOS transistor are coupled.

10. The system according to claim 9, wherein the differential signal is transmitted by the third MOS transistor being switched into the on state by the first control signal and is received by the sixth MOS transistor being switched into the on state by the second control signal, and the single-ended signal is transmitted by the third MOS transistor being switched into the off state by the first control signal and is received by the sixth MOS transistor being switched into the off state by the second control signal.

* * * * *